United States Patent
Akita et al.

(10) Patent No.: US 10,355,519 B2
(45) Date of Patent: Jul. 16, 2019

(54) POWER SUPPLY UNIT AND METHOD FOR BACKFEED PROTECTION THEREOF

(71) Applicant: Sumitomo Electric Industries, Ltd., Osaka-shi (JP)

(72) Inventors: Tetsuo Akita, Osaka (JP); Koichi Takeshita, Osaka (JP); Naoki Ayai, Osaka (JP); Tomohiro Yamaguchi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 13 days.

(21) Appl. No.: 15/743,102

(22) PCT Filed: Jun. 23, 2016

(86) PCT No.: PCT/JP2016/068696
§ 371 (c)(1),
(2) Date: Jan. 9, 2018

(87) PCT Pub. No.: WO2017/013991
PCT Pub. Date: Jan. 26, 2017

(65) Prior Publication Data
US 2019/0081505 A1 Mar. 14, 2019

(30) Foreign Application Priority Data
Jul. 21, 2015 (JP) ................................ 2015-143638

(51) Int. Cl.
*H02J 9/06* (2006.01)
*G01R 19/165* (2006.01)
(Continued)

(52) U.S. Cl.
CPC .......... *H02J 9/06* (2013.01); *G01R 19/16547* (2013.01); *H02M 7/797* (2013.01); *H02J 7/022* (2013.01)

(58) Field of Classification Search
CPC ........................................................ H02J 9/06
See application file for complete search history.

(56) References Cited

U.S. PATENT DOCUMENTS

| 9,746,522 B2* | 8/2017 | Shiraishi | G01R 31/327 |
| 2013/0229186 A1* | 9/2013 | Shiraishi | G01R 31/327 |
| | | | 324/415 |

(Continued)

FOREIGN PATENT DOCUMENTS

| JP | 2004-282812 A | 10/2004 |
| JP | 2014-197955 A | 10/2014 |

OTHER PUBLICATIONS

Masaaki Kuranuki et al. "Improving Safety of Small Energy Storage System in case of Relay Failure," Panasonic Technical Journal, May 2014, vol. 60, No. 1, pp. 26-28.

*Primary Examiner* — Daniel Kessie
(74) *Attorney, Agent, or Firm* — Baker Botts L.L.P.; Michael A. Sartori

(57) ABSTRACT

This power supply unit includes: an AC path from an input end to an output end; a first voltage sensor configured to detect an input voltage at the input end; a second voltage sensor configured to detect an output voltage at the output end; a bidirectional inverter connected to the AC path; a storage battery connected to the AC path via the bidirectional inverter; an AC switch provided between the input end and a point at which the bidirectional inverter is connected to the AC path; and a control unit configured such that, in a state in which the AC switch is controlled to be opened, if current conduction via the AC switch is detected on the basis of an operation state of the bidirectional inverter, the input voltage, and the output voltage, the control unit determines that the AC switch has failed, and stops the bidirectional inverter.

18 Claims, 13 Drawing Sheets

(51) Int. Cl.
*H02M 7/797* (2006.01)
*H02J 7/02* (2016.01)

(56) References Cited

U.S. PATENT DOCUMENTS

| | | | |
|---|---|---|---|
| 2013/0320986 A1* | 12/2013 | Shiraishi | G01R 31/327 |
| | | | 324/415 |
| 2014/0183955 A1* | 7/2014 | Colombi | H02J 3/38 |
| | | | 307/64 |
| 2014/0361725 A1* | 12/2014 | Nishikawa | H02J 9/06 |
| | | | 320/101 |
| 2015/0155711 A1* | 6/2015 | Kanayama | H02J 9/062 |
| | | | 307/80 |
| 2018/0205262 A1* | 7/2018 | Akita | H02J 9/06 |
| 2018/0212460 A1* | 7/2018 | Shibata | H02J 9/061 |

\* cited by examiner

| STATUS | WAVEFORM |
|---|---|
| (a) AC SWITCH IS NORMAL |  |
| (b) AC SWITCH IS SHORT-CIRCUITED |  |
| (c) SEMICONDUCTOR SWITCH ELEMENT Q2 IS SHORT-CIRCUITED |  |
| (c) SEMICONDUCTOR SWITCH ELEMENT Q1 IS SHORT-CIRCUITED |  |

FIG. 3

| STATUS | WAVEFORM |
|---|---|
| (a) AC SWITCH IS NORMAL | |
| (b) AC SWITCH IS SHORT-CIRCUITED | |
| (c) SEMICONDUCTOR SWITCH ELEMENT Q2 IS SHORT-CIRCUITED | |
| (c) SEMICONDUCTOR SWITCH ELEMENT Q1 IS SHORT-CIRCUITED | |

| STATUS | WAVEFORM |
|---|---|
| (a) AC SWITCH IS NORMAL |  |
| (b) AC SWITCH IS SHORT-CIRCUITED |  |
| (c) SEMICONDUCTOR SWITCH ELEMENT Q2 IS SHORT-CIRCUITED |  |
| (c) SEMICONDUCTOR SWITCH ELEMENT Q1 IS SHORT-CIRCUITED |  |

POWER SUPPLY UNIT AND METHOD FOR BACKFEED PROTECTION THEREOF

TECHNICAL FIELD

The present invention relates to a power supply unit and a method for backfeed protection thereof.

This application claims priority on Japanese Patent Application No. 2015-143638 filed on Jul. 21, 2015, the entire contents of which are incorporated herein by reference.

BACKGROUND ART

For example, an uninterruptible power supply unit (UPS) is a power supply unit that normally charges a storage battery by a commercial AC power supply and upon electric outage, converts the power stared in the storage battery to an AC power and outputs the AC power. The uninterruptible power supply unit is used for, as well as such backup for electric outage, utilizing a midnight power during daytime, or utilizing, during the night, a power obtained from a stand-alone power outlet (AC) of a power conditioner for photovoltaic generation, for example. Thus, the uninterruptible power supply unit is widely used also for effective utilization of a power.

Such an uninterruptible power supply unit is connected to, for example, a commercial power supply outlet, and an electric apparatus as a load is connected to a power outlet provided to the uninteruptible power supply unit. Normally, power is supplied from a commercial power supply directly to the load via a bypass AC path in the uninterruptible power supply unit, and a storage battery is charged in the uninterruptible power supply unit. Charging of the storage battery is performed via a converter that performs AC-to-DC conversion, and discharging of the storage battery is performed via an inverter that performs DC-to-AC conversion (see, for example, Non Patent Literature 1). The converter on the input side with respect to the storage battery and the inverter on the output side with respect to the storage battery do not operate at the same time, and therefore the input side and the output side are isolated from each other.

On the other hand, a bidirectional inverter can be used in common for charging and discharging of the storage battery. In this case, in charging of the storage battery, the bidirectional inverter operates as a converter for performing AC-to-DC conversion, and in discharging of the storage battery, the bidirectional inverter operates as an inverter for performing DC-to-AC conversion. An AC switch is provided for disconnecting the bidirectional inverter and the commercial power supply from each other in discharging of the storage battery (see, for example, Patent Literature 1).

CITATION LIST

Patent Literature

PATENT LITERATURE 1: Japanese Laid-Open Patent Publication No. 2014-197955 (FIG. 1)

Non Patent Literature

NON PATENT LITERATURE 1: Masaaki Kuranuki, Mutsuhiko Takeda, "Improving Safety of Small Energy Storage System in case of Relay Failure", Panasonic Technical Journal, May 2014, Vol. 60, No. 1, pp. 26-28

SUMMARY OF INVENTION

A power supply unit according to the present disclosure includes: an AC path from an input end to an output end in the power supply unit; a first voltage sensor configured to detect an input voltage at the input end; a second voltage sensor configured to detect an output voltage at the output end; a bidirectional inverter connected to the AC path and being capable of bidirectional power conversion; a storage battery connected to the AC path via the bidirectional inverter, an AC switch provided between the input end and a point at which the bidirectional inverter is connected to the AC path; and a control unit configured to control the bidirectional inverter and the AC switch, the control unit being configured such that, in a state in which the AC switch is controlled to be opened, if current conduction via the AC switch is detected on the basis of an operation state of the bidirectional inverter, the input voltage, and the output voltage, the control unit determines that the AC switch has failed, and stops the bidirectional inverter.

A method aspect of the present disclosure is a backfeed protection method for a power supply unit, the power supply unit including: an AC path from an input end to an output end in the power supply unit; a first voltage sensor configured to detect an input voltage at the input end; a second voltage sensor configured to detect an output voltage at the output end; a bidirectional inverter connected to the AC path and being capable of bidirectional power conversion; a storage battery connected to the AC path via the bidirectional inverter, an AC switch provided between the input end and a point at which the bidirectional inverter is connected to the AC path; and a control unit configured to control the bidirectional inverter and the AC switch, the backfeed protection method being executed by the control unit and including: in a state in which the AC switch is controlled to be opened, if states, of the input voltage and the output voltage, that should occur when the AC switch is opened are detected, determining that the AC switch is normal; and in a state in which the AC switch is controlled to be opened, if states, of the input voltage and the output voltage, that should occur when the AC switch is closed are detected, determining that the AC switch has failed and stopping the bidirectional inverter.

BRIEF DESCRIPTION OF DRAWINGS

FIG. 3 is a diagram showing the correspondence relationship between statuses and detected waveforms in relation to determinations [2] and [2'].

DESCRIPTION OF EMBODIMENTS

Figure 1:
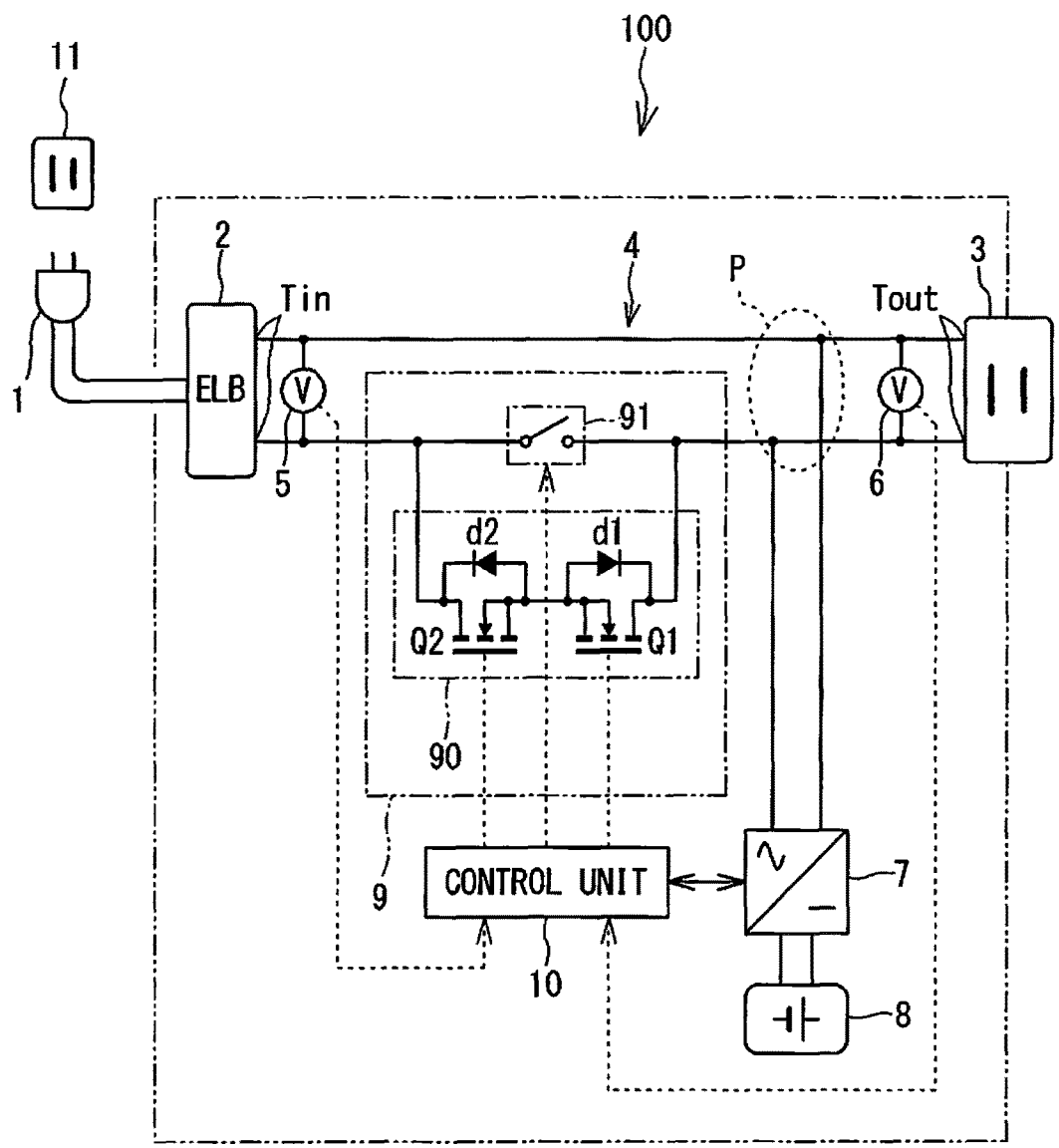
FIG. 1 is a circuit diagram showing a major part of a power supply unit.

Problems to be Solved by the Present Disclosure

Regarding the power supply unit (power storage system) as described above, section 5.1.4 of JIS C 4412-1 prescribes "backfeed protection" as follows:

"the power storage system must prevent a dangerous voltage or a dangerous energy that would occur at an AC input terminal of the power storage system after electric outage of the AC input", and "in a case where the power storage system is a plug-type power storage system, there must be no risk of electric shock from the AC input terminal when measurement is performed one second after disconnection from the input AC power supply".

In a case of using the bidirectional inverter applicable in common for charging and discharging, the above requirements of the JIS standard are satisfied as long as the aforementioned AC switch is normal. However, since requirement satisfaction depends on the AC switch, if the AC switch fails (is welded or short-circuited), an output via the bidirectional inverter from the storage battery can arise also at the input end. Further, in this case, when a plug of the power supply unit is extracted from an outlet of a commercial power supply, a person might be electrically shocked by the exposed blades of the plug.

In view of the above problems, an object of the present disclosure is to further enhance, in the power supply unit, reliability of backfeed protection which is ensured to a certain degree owing to presence of the AC switch.

Effects of the Present Disclosure

According to the present disclosure, it is possible to detect failure (welding or short-circuit) of the AC switch by two voltage sensors and the control unit. If the failure is detected, the bidirectional inverter is stopped, whereby occurrence of a voltage due to the output of the bidirectional inverter can be reliably prevented. Thus, reliability of backfeed protection can be further enhanced.

SUMMARY OF EMBODIMENTS

Summary of the embodiments of the present invention includes at least the following.

(1) This power supply unit includes: an AC path from an input end to an output end in the power supply unit; a first voltage sensor configured to detect an input voltage at the input end; a second voltage sensor configured to detect an output voltage at the output end; a bidirectional inverter connected to the AC path and being capable of bidirectional power conversion; a storage battery connected to the AC path via the bidirectional inverter; an AC switch provided between the input end and a point at which the bidirectional inverter is connected to the AC path; and a control unit configured to control the bidirectional inverter and the AC switch, the control unit being configured such that, in a state in which the AC switch is controlled to be opened, if current conduction via the AC switch is detected on the basis of an operation state of the bidirectional inverter, the input voltage, and the output voltage, the control unit determines that the AC switch has failed, and stops the bidirectional inverter.

In the above power supply unit, it is possible to detect failure (welding or short-circuit) of the AC switch by two voltage sensors and the control unit on the basis of a fact that, when the AC switch has failed to be constantly conductive, a voltage that should not occur in a normal state is detected as the input voltage or the output voltage. If the failure is detected, the bidirectional inverter is stopped, whereby occurrence of a voltage due to the output of the bidirectional inverter can be reliably prevented.

(2) In the power supply unit of (1), the AC switch is formed of, for example: an electromagnetically-driven-type relay contact; a bidirectional semiconductor switch; or the relay contact and the semiconductor switch connected in parallel with each other.

It is noted that the semiconductor switch may be composed of a pair of semiconductor switch elements having parallel diodes and connected in series in directions opposite to each other, or may be composed of one bidirectional semiconductor switch element.

The relay contact might be welded. The semiconductor switch might be short-circuited. In addition, if the semiconductor switch is composed of a pair of semiconductor switch elements connected in series in directions opposite to each other, only one of the semiconductor switch elements might be short-circuited. Such a failure is mainly reflected in detection values of the first voltage sensor and the second voltage sensor. Therefore, it is possible to grasp what failure has occurred on the basis of the detection values.

(3) (Determination [1])

In the power supply unit of (1) or (2), in a state in which an AC voltage is supplied from outside to the input end and the AC switch is controlled to be opened and in which the bidirectional inverter is not caused to operate, the control unit can determine that the AC switch has failed if the first voltage sensor and the second voltage sensor both detect voltages having effective values equal to or greater than a predetermined value and the second voltage sensor repeatedly detects a voltage of which an absolute value of an instantaneous value is equal to or greater than a predetermined value.

In this case, at the time of starting the power supply unit, if failure (welding or short-circuit) of the AC switch has occurred before the bidirectional inverter is caused to operate, the failure can be detected.

(4) (Determination [2])

In the power supply unit of (1) or (2), in a state in which an AC voltage is not supplied from outside to the input end and the AC switch is controlled to be opened and in which the bidirectional inverter is started to operate, the control unit can determine that the AC switch has failed if the following state continues during a predetermined period or longer, the state being a state in which: the first voltage sensor and the second voltage sensor both detect voltages having effective values equal to or greater than a predetermined value; and an absolute value of a difference between an instantaneous value of the voltage detected by the first voltage sensor and an instantaneous value of the voltage detected by the second voltage sensor is equal to or smaller than a predetermined value.

In this case, it is possible to prevent a voltage based on the output voltage of the bidirectional inverter from arising at the input end when the AC switch has failed.

(5) (Determination [2'])

In the power supply unit of (1) or (2), in a state in which an AC voltage is not supplied from outside to the input end and the AC switch is controlled to be opened and in which the bidirectional inverter is started to operate, the control unit can determine that the AC switch has failed if the following state continues during a predetermined period or longer, the state being a state in which: the first voltage sensor and the second voltage sensor both detect voltages having effective values equal to or greater than a predetermined value; a difference between maximum values or minimum values, in one AC cycle, of an instantaneous value of the voltage detected by the first voltage sensor and an instantaneous value of the voltage detected by the second voltage sensor is equal to or smaller than a predetermined value.

In this case, it is possible to prevent a voltage based on the output voltage of the bidirectional inverter from arising at the input end when the AC switch has failed.

(6) (Determination [3])

In the power supply unit of (1) or (2), in a case where the bidirectional inverter is started to operate while an AC voltage is supplied from outside to the input end, the control unit can provide a no-output period until the operation of the bidirectional inverter is started, after controlling the AC switch to be opened, and the control unit can determine that the AC switch has failed if, in the no-output period, the following state continues during a predetermined period or longer, the state being a state in which: the first voltage sensor and the second voltage sensor detect voltage values equal to or greater than a predetermined value; and an absolute value of a difference between an instantaneous value of the voltage detected by the first voltage sensor and an instantaneous value of the voltage detected by the second voltage sensor is equal to or smaller than a predetermined value.

In this case, when there is an AC voltage from outside, the no-output period is provided immediately before the bidirectional inverter is started to operate, whereby, if the AC switch has failed, the failure can be detected.

(7) (Determination [4])

In the power supply unit of (1) or (2), irrespective of whether or not an AC voltage is being supplied from outside to the input end, in a state in which the AC switch is controlled to be opened and the bidirectional inverter is caused to operate, the control unit can actively change electric characteristics of an output of the bidirectional inverter, and the control unit can determine that the AC switch has failed if it is detected that change occurring in the voltage detected by the first voltage sensor follows the voltage detected by the second voltage sensor.

In this case, when eventually an AC voltage is not supplied from outside and there is an output voltage from the bidirectional inverter, if failure of the AC switch has occurred, the failure can be detected by changing, for example, the frequency or the amplitude of the output of the bidirectional inverter.

(8) (Determination [2"])

In the power supply unit of (1) or (2), in a state in which an AC voltage is not supplied from outside to the input end and the AC switch is controlled to be opened and in which the bidirectional inverter is caused to operate, the control unit can determine that the AC switch has failed if the following state occupies a predetermined time proportion, the state being a state in which: the first voltage sensor and the second voltage sensor both detect voltages having effective values equal to or greater than a predetermined value; and a difference between maximum values or minimum values, in one AC cycle, of an instantaneous value of the voltage detected by the first voltage sensor and an instantaneous value of the voltage detected by the second voltage sensor is equal to or smaller than a predetermined value.

In this case, it is possible to prevent a voltage based on the output voltage of the bidirectional inverter from arising at the input end when the AC switch has failed.

(9) (Determination [5])

In the power supply unit of (1) or (2), in a state in which an AC voltage is not supplied from outside to the input end and the AC switch is controlled to be opened and in which the bidirectional inverter is caused to operate, the control unit can determine that the AC switch has failed if the following state continues during a predetermined period or longer, the state being a state in which: the first voltage sensor and the second voltage sensor both detect voltages of which absolute values of average values in one AC cycle on one of a positive side and a negative side are equal to or greater than a predetermined value, and detect voltages of which absolute values of average values in one AC cycle on the other of the positive side and the negative side are equal to or smaller than a predetermined value; and a difference between maximum values or minimum values, in a half AC cycle, of an instantaneous value of the voltage detected by the first voltage sensor and an instantaneous value of the voltage detected by the second voltage sensor is equal to or smaller than a predetermined value.

In this case, it is possible to prevent a voltage based on the output voltage of the bidirectional inverter from arising at the input end when the AC switch has failed.

(10) A method aspect is a backfeed protection method for a power supply unit, the power supply unit including: an AC path from an input end to an output end in the power supply unit; a first voltage sensor configured to detect an input voltage at the input end; a second voltage sensor configured to detect an output voltage at the output end; a bidirectional inverter connected to the AC path and being capable of bidirectional power conversion; a storage battery connected to the AC path via the bidirectional inverter, an AC switch provided between the input end and a point at which the bidirectional inverter is connected to the AC path; and a control unit configured to control the bidirectional inverter and the AC switch, the backfeed protection method being executed by the control unit and including: in a state in which the AC switch is controlled to be opened, if states, of the input voltage and the output voltage, that should occur when the AC switch is opened are detected, determining that the AC switch is normal; and in a state in which the AC switch is controlled to be opened, if states, of the input voltage and the output voltage, that should occur when the AC switch is closed are detected, determining that the AC switch has failed and stopping the bidirectional inverter.

In the above backfeed protection method for the power supply unit, it is possible to detect failure (welding or short-circuit) of the AC switch by two voltage sensors and the control unit on the basis of a fact that, when the AC switch has failed to be constantly conductive, a voltage that should not occur in a normal state is detected as the input voltage or the output voltage. If the failure is detected, the bidirectional inverter is stopped, whereby occurrence of a voltage due to the output of the bidirectional inverter can be reliably prevented.

DETAILS OF EMBODIMENTS

Hereinafter, the details of embodiments of the present invention will be described with reference to the drawings.

<<Circuit Configuration of Power Supply Unit>>

FIG. 1 is a circuit diagram showing a major part of a power supply unit. In FIG. 1, the power supply unit 100 includes: a plug 1 for AC input; an earth leakage circuit breaker 2 connected to the plug 1; an AC power outlet 3; AC paths 4 composed of two electric paths from an input end Tin to an output end Tout in the power supply unit 100; a first voltage sensor 5 for detecting an input voltage at the input end Tin; a second voltage sensor 6 for detecting an output voltage at the output end Tout; a bidirectional inverter 7 connected to the AC paths 4 and capable of bidirectional power conversion; a storage battery 8 connected to the AC paths 4 via the bidirectional inverter 7; an AC switch 9; and a control unit 10. Operation of the bidirectional inverter 7 is controlled by the control unit 10. It is noted that, in FIG. 1, the AC switch 9 is provided on the neutral-side one, of the two lines of the AC paths 4. However, without limitation thereto, the AC switch 9 may be provided on the live side or may be provided on both sides.

It is noted that a DC/DC converter may be provided between the bidirectional inverter 7 and the storage battery 8, but is omitted here.

In FIG. 1, the secondary side of the earth leakage circuit breaker 2 is regarded as the input end Tin. However, the primary side of the earth leakage circuit breaker 2 may be regarded as the input end Tin.

The AC switch 9 is interposed on one line of the AC paths 4, between the input end Tin and a connection point P at which the bidirectional inverter 7 is connected to the AC paths 4. It is noted that, as described above, the AC switch 9 may be provided on the other line or both lines. The AC switch 9 includes a relay contact 91 to be electromagnetically driven, and a bidirectional semiconductor switch 90 connected in parallel to the relay contact 91. The semiconductor switch 90 is composed of a pair of semiconductor switch elements Q1, Q1 having parallel diodes d1, d2 and connected in series in directions opposite to each other. It is noted that the semiconductor switch 90 may be composed of one bidirectional semiconductor switch element, or a relay to be electromagnetically driven may be used in place of the semiconductor switch 90.

The semiconductor switch elements Q1, Q2 are, for example, MOSFETs (Metal-Oxide-Semiconductor Field Effect Transistors), and the parallel diodes d1, d2 are body diodes. It is noted that the semiconductor switch elements Q1, Q2 may be IGBTs (Insulated Gate Bipolar Transistors) having parallel diodes d1, d2.

The relay contact 91 and the semiconductor switch elements Q1, Q2 are controlled by the control unit 10. In addition, detection signals from the first voltage sensor 5 and the second voltage sensor 6 are sent to the control unit 10.

The control unit 10 includes, for example, a computer, and achieves a necessary control function by the computer executing software (computer program). The software is stored in a storage device (not shown) of the control unit 10. It is noted that the control unit 10 may be configured by a circuit formed from only hardware not including a computer.

It is noted that a control power supply voltage needed in the power supply unit 100 can be obtained from the storage battery 8 or the plug 1 connected to an outlet 11.

<<Basic Operation of Power Supply Unit>>

In the power supply unit 100, normally, the plug 1 is connected to the outlet 11 of a commercial power supply or a stand-alone output of a power conditioner (hereinafter, referred to as a commercial power supply, etc.), and an electric apparatus (not shown) as a load is connected to the AC power outlet 3. In a state in which the plug 1 is just inserted into the outlet 11, the power supply unit 100 is still not started, and therefore, the AC switch 9 is in an opened state and an AC voltage is not outputted to the AC power outlet 3. Here, when a start switch (not shown) of the power supply unit 100 is turned on, the power supply unit 100 is started.

By the starting, the control unit 10 controls the semiconductor switch elements Q1, Q2 and the relay contact 91 to be turned ON at the zero point of the input voltage on the basis of a detection signal from the first voltage sensor 5. As a result, the semiconductor switch elements Q1, Q2 having faster responses are first turned from OFF to ON. Then, the relay contact 91 is closed a little later. The relay contact 91, which is closed later after the semiconductor switch 90 is closed, is closed in a state in which a potential difference between the contacts is extremely small, and therefore the contacts can be protected. After the relay contact 91 is closed, the control unit 10 turns off the semiconductor switch elements Q1, Q2. In a case of continuing the usage in ON states, it is preferable to use the relay contact 91 having a smaller ON resistance than the semiconductor switch 90.

When the AC switch 9 has been closed in this way, an output voltage is provided to the AC power outlet 3, and it becomes possible to charge the storage battery 8. The control unit 10 causes the bidirectional inverter 7 to perform AC-to-DC conversion operation, whereby the storage battery 8 can be charged.

The storage battery 8 is discharged to supply power in the following cases:

(#1) a case where electric outage (or stop of electric generation) of the commercial power supply, etc., occurs or the plug 1 is extracted from the outlet 11, and (#2) a case of desiring to supply power from the storage battery 8 without depending on an output from the outlet 1, by manipulation of a manipulation switch (not shown).

In the case of (#1) or (#2), the control unit 10 switches operation of the bidirectional inverter 7 to DC-to-AC conversion and causes the storage battery 8 to discharge, to continue to supply a power to the load. At the same time, the control unit 10 opens the AC switch 9. In the case of (#2), since there is an input voltage, the control unit 10 opens the AC switch 9 at the zero cross point of the input voltage and at the same time, starts output from the storage battery 8.

In a case where the lost input voltage is recovered or a case of returning to a mode in which the input voltage is directly outputted, the conversion operation (DC to AC) of the bidirectional inverter 7 is stopped at the zero cross point of the input voltage, and the AC switch 9 is closed.

<Backfeed Protection>>

(Outline)

Next, backfeed protection which is the main point of the present embodiment will be described. The backfeed protection is prescribed in section 5.1.4 of JIS C 4412-1 as described above and is a prescription for preventing a voltage generated inside the power supply unit 100 from arising at the input end Tin or the blades of the plug 1.

In a case of the power supply unit 100 of the present embodiment, a voltage arising at the blades of the plug 1 needs to be not greater than DC 60 V and AC 42 V within one second after the plug 1 is extracted from the outlet 11, for example. Normally, if the plug 1 is extracted from the outlet 11, the AC switch 9 is opened and the storage battery 8 starts to discharge, and therefore no voltage arises at the input end Tin. However, if the AC switch 9 fails (the relay contact 91 is welded or the semiconductor switch elements Q1, Q2 are short-circuited), a voltage based on the output voltage of the bidirectional inverter 7 arises at the input end Tin and the blades of the plug 1. Hereinafter, control for backfeed protection so as to prevent such a voltage from arising will be described.

As failure patterns of the AC switch 9 relevant to backfeed protection, the following patterns are assumed.

(i) The relay contact 91 is welded in a closed state, or both semiconductor switch elements Q1, Q2 are short-circuited and remain in this state.

(ii) One of the semiconductor switch elements Q1, Q2 is short-circuited and remains in this state.

The case (i) means short-circuit of the AC switch 9, and the case (ii) means short-circuit depending on the direction of a current in the AC switch 9.

It is noted that, in a case where the AC switch has only an electromagnetically-driven-type relay, only the case (i) can occur as a failure pattern.

Accordingly, the control unit 10 determines whether or not such a failure of the AC switch 9 has occurred, and if the control unit 10 determines that the failure has occurred, the control unit 10 prevents generation of a voltage inside the power supply unit 100.

Various ways of determinations are conceivable depending on the situations in which the above failure patterns occur.

Hereinafter, each type of the determinations will be described.

(Determination [1])

Determination [1] is a determination as to whether or not failure has occurred in the AC switch 9 at the time of starting the power supply unit 100, i.e., in a state in which an input voltage is supplied to the input end Tin but control of closing the AC switch 9 has not been performed yet, in FIG. 1.

Figure 2:
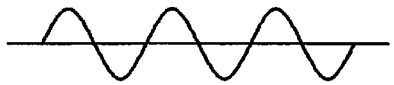
FIG. 2 is a diagram showing the correspondence relationship between statuses and detected waveforms in relation to determination [1].
Figure 2:
Figure 2:
Figure 2:
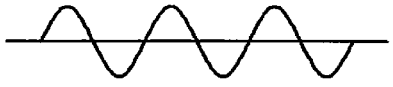

FIG. 2 is a diagram showing the correspondence relationship between statuses and detected waveforms. It is noted that, actually, the control unit 10 samples each detection signal from the first voltage sensor 5 and the second voltage sensor 6 at high speed.

First, if the AC switch 9 is normal, all the three elements of the relay contact 91 and the semiconductor switch elements Q1, Q2 should be OFF and opened. In this case, the first voltage sensor 5 detects an input voltage shown on the upper side in (a) of FIG. 2 but the second voltage sensor 6 detects no voltage (the lower side).

On the other hand, in a case where the relay contact 91 is welded or both semiconductor switches Q1, Q2 are short-circuited as in the failure pattern (i), i.e., in a case where the AC switch 9 is short-circuited, the input voltage is transmitted through the AC paths 4, and the second voltage sensor 6 detects a voltage having the same waveform as that detected by the first voltage sensor 5 ((b) in FIG. 2).

In the case of the failure pattern (ii), if the semiconductor switch Q1 is short-circuited, a route that passes from the semiconductor switch Q1 through the parallel diode d2 of the other semiconductor switch Q2 (opened) is established. Therefore, when the sign of the input voltage is one of plus and minus, the second voltage sensor 6 repeatedly detects a voltage ((d) in FIG. 2).

In the case of the failure pattern (ii), if the semiconductor switch Q2 is short-circuited, a route that passes from the semiconductor switch Q2 through the parallel diode d1 of the other semiconductor switch Q1 (opened) is established. Therefore, when the sign of the input voltage is the other of plus and minus, the second voltage sensor 6 repeatedly detects a voltage ((c) in FIG. 2).

(Determination Condition for Determination [1])

As a determination condition for determination [1], it is required that all the states of (b), (c), (d) in FIG. 2 are determined as a failure. It is noted that, in a case where the AC switch 9 is formed from only an electromagnetically-driven-type relay, determination may be performed only for the state of (b).

Accordingly, as a determination condition for determination [1] in a state in which an AC voltage is supplied from outside to the input end Tin and the AC switch 9 is controlled to be opened and in which the bidirectional inverter 7 is not caused to operate, the control unit 10 determines that the AC switch 9 has failed if the first voltage sensor 5 and the second voltage sensor 6 both detect voltages having effective values equal to or greater than a predetermined value (e.g., 40 V) and the second voltage sensor 6 repeatedly (e.g., forty times successively) detects a voltage of which the absolute value of the instantaneous value is equal to or greater than a predetermined value (e.g., 40 V).

At the time of starting the power supply unit 100, if failure (welding or short-circuit) of the AC switch 9 has occurred before the bidirectional inverter 7 is caused to operate, the failure can be detected by the above determination.

(Determination [2], Determination [2'])

Next, a case where failure has occurred in the AC switch 9 in a state in which an AC voltage is not supplied from outside to the input end Tin and the AC switch 9 is controlled to be opened and in which the bidirectional inverter 7 is started to operate, will be described.

FIG. 3 is a diagram showing the correspondence relationship between statuses and detected waveforms.

First, if the AC switch 9 is normal, all the three elements of the relay contact 91 and the semiconductor switch elements Q1, Q2 should be OFF and opened. In this case, the second voltage sensor 6 detects an output voltage shown on the lower side in (a) of FIG. 3, but the first voltage sensor 5 detects no voltage (the upper side).

On the other hand, in a case where the relay contact 91 is welded or both semiconductor switches Q1, Q2 are short-circuited as in the failure pattern (i), i.e., in a case where the AC switch 9 is short-circuited, the output voltage is transmitted through the AC paths 4, so that the first voltage sensor 5 detects a voltage having the same waveform as that detected by the second voltage sensor 6 ((b) in FIG. 3).

In the case of the failure pattern (ii), if the semiconductor switch Q1 is short-circuited, a route that passes from the semiconductor switch Q1 through the parallel diode d2 of the other semiconductor switch Q2 (opened) is established. Therefore, when the sign of the input voltage is one of plus and minus, the first voltage sensor 5 repeatedly detects a voltage ((d) in FIG. 3).

In the case of the failure pattern (ii), if the semiconductor switch Q2 is short-circuited, a route that passes from the semiconductor switch Q2 through the parallel diode d1 of the other semiconductor switch Q1 (opened) is established.

Therefore, when the sign of the input voltage is the other of plus and minus, the first voltage sensor 5 repeatedly detects a voltage ((c) in FIG. 3).

(Determination [2])

Here, a determination for (b) of FIG. 3 in the failure pattern (i) is defined as determination [2]. A determination for (c), (d) of FIG. 3 in the failure pattern (ii) is defined as determination [2'].

(Determination Condition for Determination [2])

As a determination condition for determination [2], the control unit 10 determines that the AC switch 9 has failed if the following state continues during a predetermined period (20 ms) or longer, the state being a state in which: the first voltage sensor 5 and the second voltage sensor 6 both detect voltages having effective values equal to or greater than a predetermined value (e.g., 10 V); and the absolute value of a difference between the instantaneous value of the voltage detected by the first voltage sensor 5 and the instantaneous value of the voltage detected by the second voltage sensor 6 is equal to or smaller than a predetermined value (e.g., 10 V).

On the basis of this determination, it is possible to prevent a voltage based on the output voltage of the bidirectional inverter 7 from arising at the input end Tin when the AC switch 9 has failed.

(Determination [2'])

Figure 4:
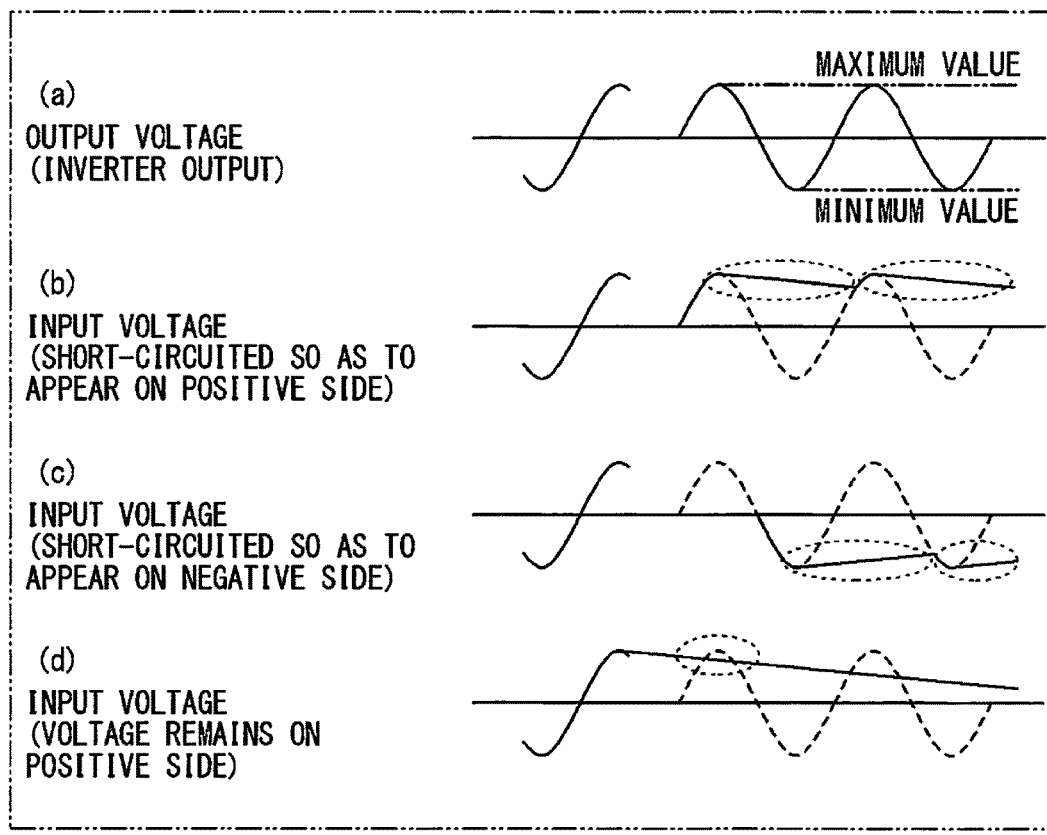
FIG. 4 is a waveform diagram for supplemental consideration about one-side short-circuit of a semiconductor switch in relation to determination [2'].

FIG. 4 is a waveform diagram for supplemental consideration about one-side short-circuit of the semiconductor switches Q1, Q2 (short-circuit of Q1 or Q2). In FIG. 4, the positive-side peak of the output voltage in (a) is regarded as the maximum value and the negative-side peak thereof is regarded as the minimum value. In a case of one-side short-circuit, a waveform of the input voltage as shown in (b) or (c) appears. In either waveform, a value close to the maximum value or the minimum value of the output voltage repeatedly appears. On the other hand, instead of failure of the AC switch 9, it is also assumed that merely the input voltage is left on the positive side on which the AC switch 9 is not provided. However, in this case, as shown in (d), the voltage gradually decreases and therefore repetition of a value close to the positive maximum value or the negative minimum value does not occur. Accordingly, the case (d) is excluded and a determination condition for detecting the states of (b), (c) is defined as follows.

(Determination Condition for Determination [2'])

As a determination condition for determination [2'], the control unit 10 determines that the AC switch 9 has failed if the following state continues during a predetermined period (40 ms) or longer, the state being a state in which: the first voltage sensor 5 and the second voltage sensor 6 both detect voltages having effective values equal to or greater than a predetermined value (e.g., 10 V); and a difference between the maximum values or the minimum values, in one AC cycle, of the instantaneous value of the voltage detected by the first voltage sensor 5 and the instantaneous value of the voltage detected by the second voltage sensor 6 is equal to or smaller than a predetermined value (10 V).

On the basis of this determination, it is possible to prevent a voltage based on the output voltage of the bidirectional inverter 7 from arising at the input end when the AC switch 9 has failed.

(Determination [3])

Next, in a case where the bidirectional inverter 7 is started to operate while an AC voltage is being supplied from outside to the input end Tin, what determination the control unit 10 can perform after controlling the AC switch 9 to be opened will be described.

If there is an input voltage at the input end Tin, the input voltage makes "collision" with the output of the bidirectional inverter 7. Therefore, it is desired to perform the determination before the collision.

Figure 5:
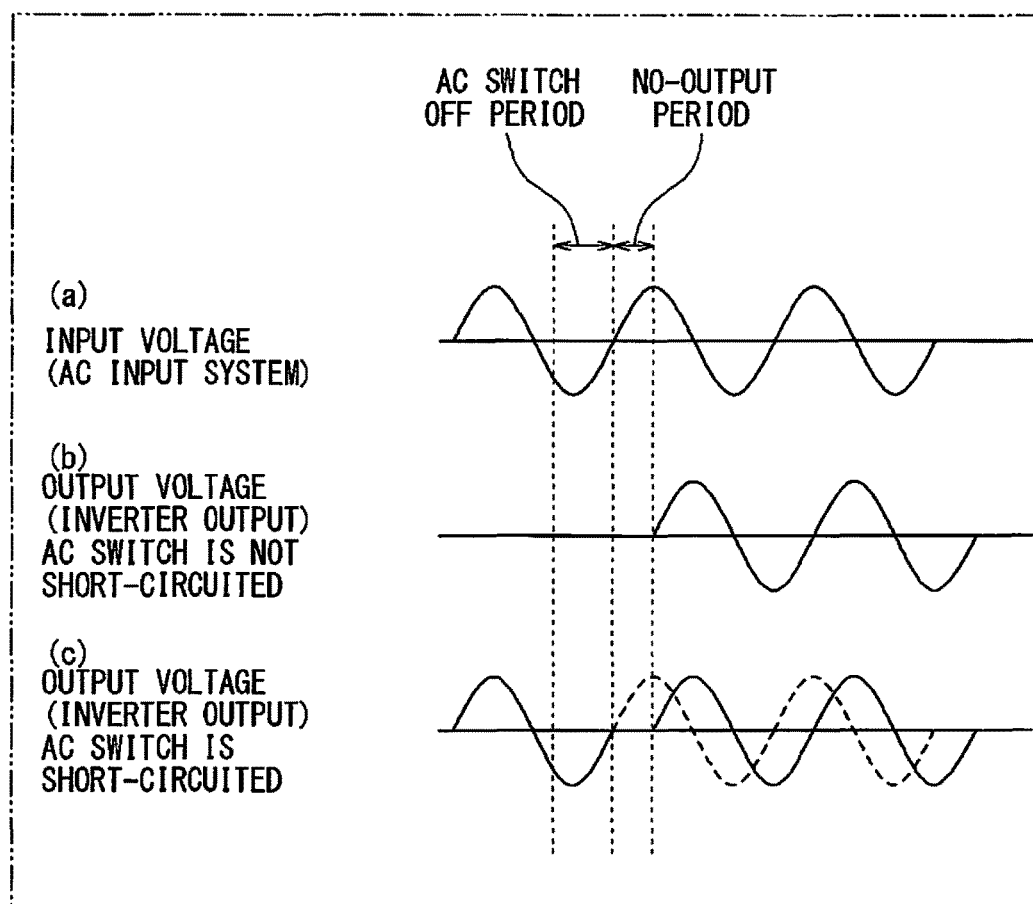
FIG. 5 is a diagram showing waveforms of an input voltage and an output voltage in relation to determination [3].

FIG. 5 is a diagram showing the waveforms of the input voltage and the output voltage in this case. In FIG. 5, (a) indicates the input voltage. After a period in which the AC switch 9 is controlled to be opened, a no-output period is provided immediately before the bidirectional inverter 7 is started to operate. If the AC switch 9 is not short-circuited, the output voltage has a waveform shown in (b). On the other hand, if the AC switch 9 is short-circuited, the output voltage has a waveform shown in (c).

Figure 6:
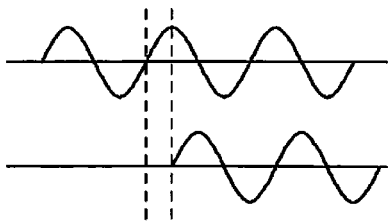
FIG. 6 is a diagram showing the correspondence relationship between statuses and detected waveforms in relation to determination [3].
Figure 6:
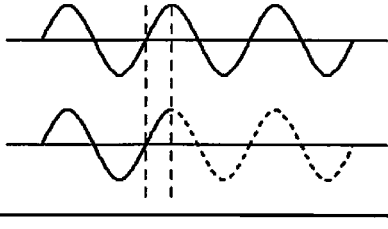
Figure 6:
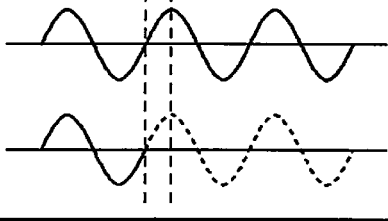
Figure 6:
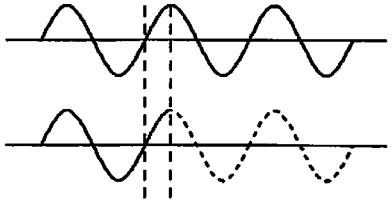

FIG. 6 is a diagram showing the correspondence relationship between statuses and detected waveforms. If the AC switch 9 is normal, as shown in (a), the input voltage (above) and the output voltage (below) have phases different from each other and thus are different in instantaneous voltage, except for a case where their phases incidentally coincide with each other. If the relay contact 91 is welded, as shown in (b), the input voltage and the output voltage coincide with each other during the no-output period between two dotted lines. If the semiconductor switch Q2 is short-circuited, in the example shown in (c), the input voltage and the output voltage do not coincide with each other during the no-output period and therefore short-circuit cannot be detected. If the semiconductor switch Q1 is short-circuited, as shown in (d), the input voltage and the output voltage coincide with each other during the no-output period and therefore short-circuit can be detected. The results of (c) and (d) are reversed depending on the phases.

(Determination Condition for Determination [3])

In determination [3], in a case where the bidirectional inverter 7 is started to operate while an AC voltage is being supplied from outside to the input end Tin, the control unit 10 provides a no-output period (e.g., 3 ms) until the operation of the bidirectional inverter 7 is started, after controlling the AC switch 9 to be opened. Then, the control unit 10 determines that the AC switch 9 has failed if, in the no-output period, the following state continues during a predetermined period (e.g., 1.5 ms) or longer, the state being a state in which: the first voltage sensor 5 and the second voltage sensor 6 detect voltage values equal to or greater than a predetermined value (e.g., 50 V); and the absolute value of a difference between the instantaneous value of the voltage detected by the first voltage sensor 5 and the instantaneous value of the voltage detected by the second voltage sensor 6 is equal to or smaller than a predetermined value (10 V).

As described above, when there is an AC voltage from outside, the no-output period is provided immediately before the bidirectional inverter 7 is started to operate, whereby, if the AC switch 9 has failed, the failure can be detected.

(Determination [4])

Next, detection for failure of the AC switch 9 is performed in a state in which the AC switch 9 is controlled to be opened and the bidirectional inverter 7 is caused to operate, irrespective of whether or not an AC voltage is being supplied from outside to the input end Tin. In this case, there might be an input voltage, and therefore, even if comparison between the input voltage and the output voltage is performed, in a case where their phases coincide with each other, it is impossible to discriminate whether the AC switch 9 is short-circuited or there merely is an input voltage.

Figure 7:
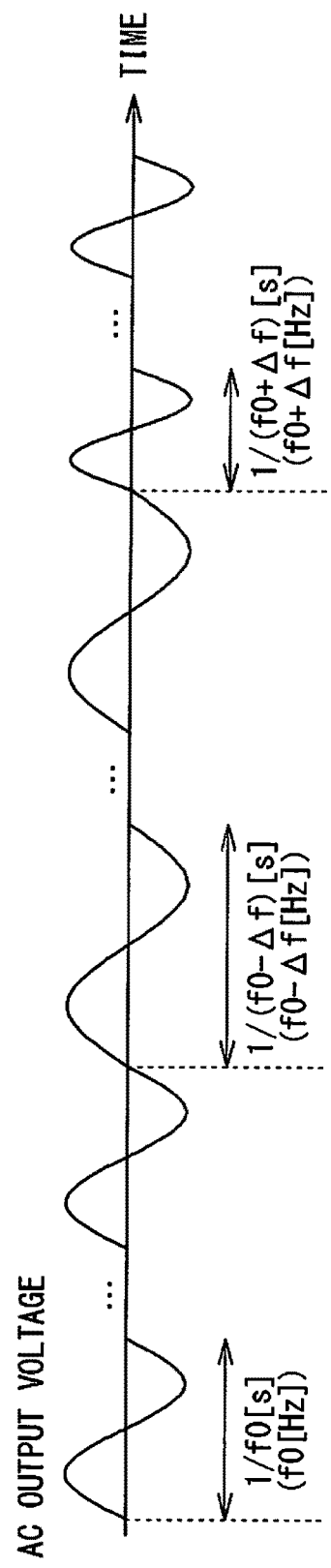
FIG. 7 is a waveform diagram showing an example in which the frequency of the output of a bidirectional inverter 7 is actively changed, in relation to determination [4].

FIG. 7 is a waveform diagram showing an example in which the frequency of the output of the bidirectional inverter 7 is actively changed. That is, initially, the frequency is set at f0 [Hz] and one cycle is set at (1/f0) [s], and hereafter, the frequency is changed to (f0−Δf) [Hz], and then (f0+Δf) [Hz]. In detail, if time is denoted by t, an output voltage target value is denoted by Vout*, a fundamental frequency target value is denoted by f0*, and a minute frequency variation is denoted by fact*, Vout* is represented as follows:

$$Vout^* = 2^{1/2} \times 101 \times \sin(\{2\pi(f0^* + fact^*)t\}.$$

The value fact* is periodically varied to 0, +Δf, and −Δf (Δf is minute). Then, feedback control is performed so that the actual output voltage Vout# becomes Vout*.

It is noted that the electric characteristics to be actively changed are not limited to the frequency. Such change may be given using phase, amplitude, or offset.

In a case where there is no input voltage from outside to the input end Tin and the AC switch 9 is normally opened, the voltage detected by the first voltage sensor 5 is substantially zero. In a case where there is an input voltage from outside, even if the AC switch 9 is short-circuited, the input voltage does not follow the change. In a case where there is no input voltage from outside and the AC switch 9 is short-circuited, a phenomenon in which the input voltage follows the change of the output voltage occurs.

(Determination Condition for Determination [4])

Accordingly, the control unit 10 actively changes the electric characteristics of the output of the bidirectional inverter 7, and if it is detected that change arising in the voltage detected by the first voltage sensor 5 follows the voltage detected by the second voltage sensor 6 (for example, the frequency of the input voltage continues to vary within ±0.4 Hz during twelve cycles), the control unit 10 determines that the AC switch 9 has failed.

In this case, when eventually an AC voltage is not supplied from outside and there is an output voltage from the bidirectional inverter 7, if failure of the AC switch 9 has occurred, the failure can be detected by changing, for example, the frequency or the amplitude of the output of the bidirectional inverter 7.

Figure 13:
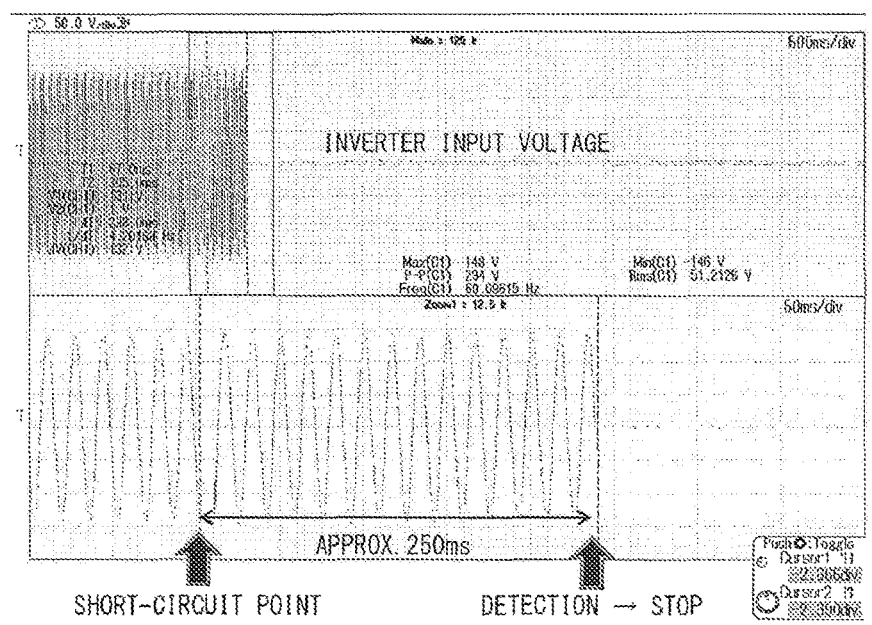
FIG. 13 shows measurement data when determination is performed in determination [4].

FIG. 13 shows measurement data when determination is performed in determination [4]. A waveform at the lower stage is a waveform obtained by enlarging, in the time-axis direction, a part of a waveform at the upper stage. The measurement data indicate that, within one second (250 ms) after the plug 1 is extracted, detection of short-circuit and stop of the bidirectional inverter 7 are performed, and the voltage of the plug 1 satisfies the required backfeed standard.

(Determination [2″])

Next, failure determination for one-side short-circuit in the semiconductor switch 90 is performed in a state in which an AC voltage is not supplied from outside to the input end Tin and the AC switch 9 is controlled to be opened and in which the bidirectional inverter 7 is caused to operate.

In this case, a waveform that is half-wave rectified by one-side short-circuit appears as the input voltage, and therefore detection cannot be performed using the active change in determination [4]. Accordingly, determination is performed on the basis of whether or not the maximum values or the minimum values coincide with each other.

(Determination Condition for Determination [2″])

Accordingly, the control unit 10 determines that the AC switch has failed if the following state occupies a predetermined time proportion (e.g., such a state is detected for 100 ms within 250 ms), the state being a state in which: the first voltage sensor 5 and the second voltage sensor 6 both detect voltages having effective values equal to or greater than a predetermined value (e.g., 10 V); and a difference between the maximum values or the minimum values of the instantaneous value of the voltage detected by the first voltage sensor 5 and the instantaneous value of the voltage detected by the second voltage sensor 6 is equal to or smaller than a predetermined value (e.g., 10 V).

On the basis of this determination, it is possible to prevent a voltage based on the output voltage of the bidirectional inverter 7 from arising at the input end Tin when the AC switch 9 has failed.

(Determination [5])

Next, determination for one-side short-circuit of the semiconductor switch 90 during output operation of the bidirectional inverter 7 will be described.

Figure 8:
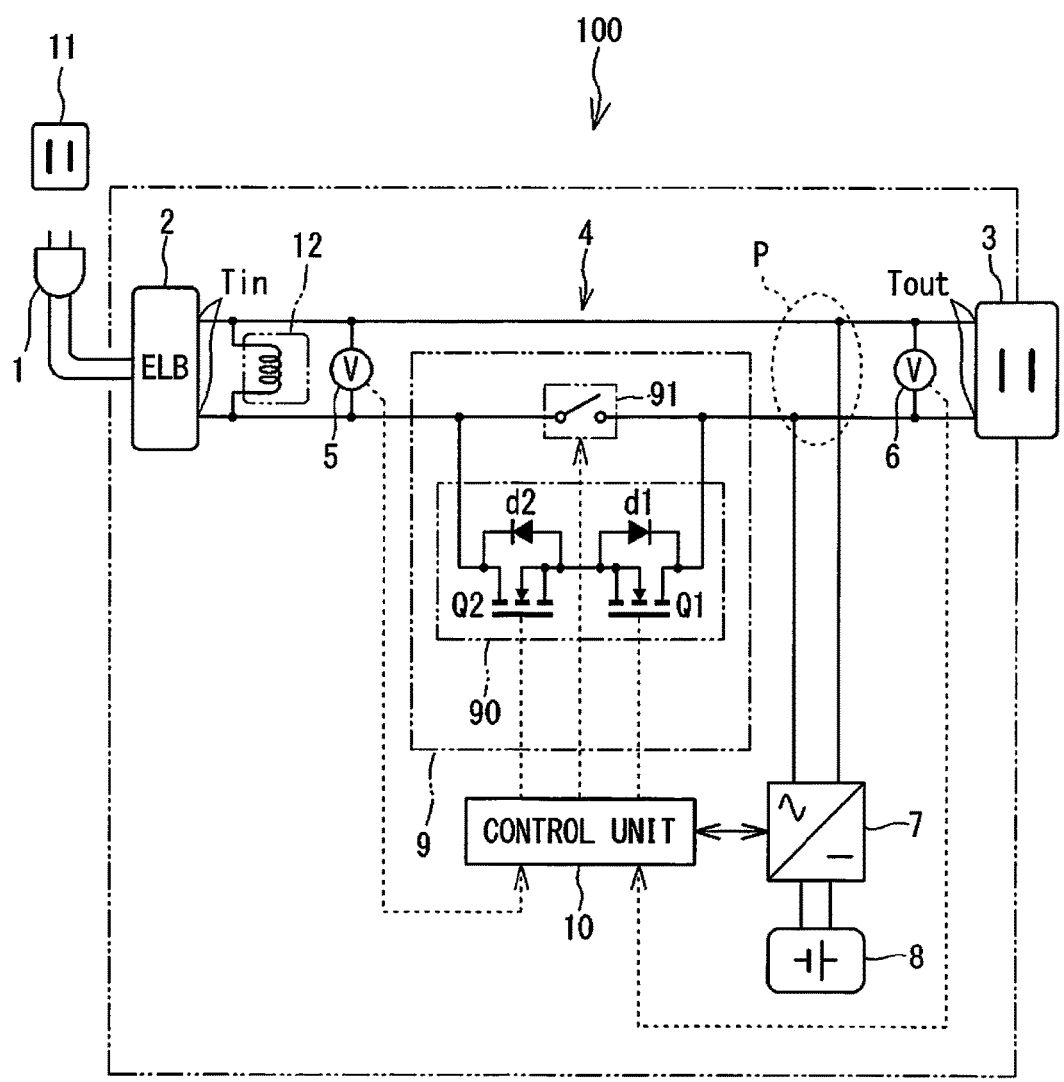
FIG. 8 is a circuit diagram of another power supply unit different from that in FIG. 1.

FIG. 8 is a circuit diagram of another power supply unit 100 different from that in FIG. 1. A difference from FIG. 1 is that a relay 12 as a load is connected to the input end Tin. When such a load is provided, the voltage at the input end Tin drops more quickly.

Figure 9:
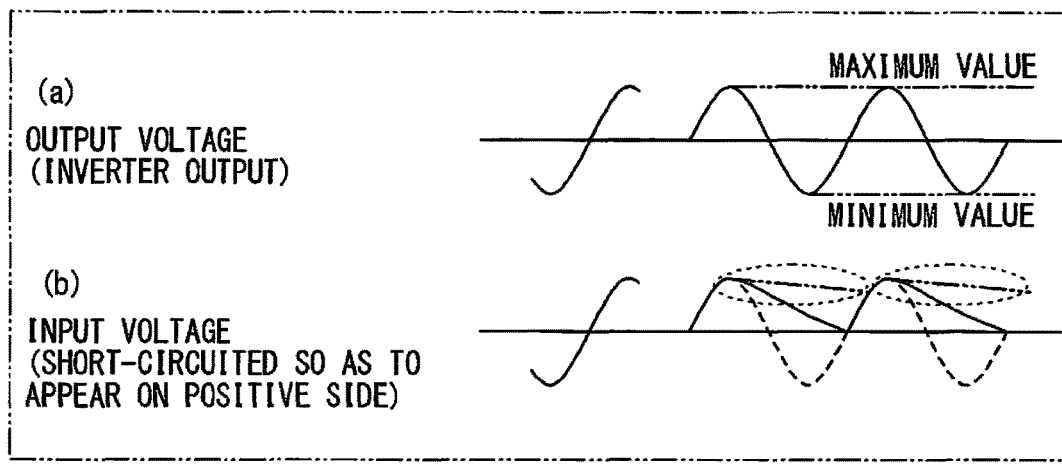
FIG. 9 is a diagram showing an example of voltage drop in relation to determination [5].

FIG. 9 is a diagram showing an example of such voltage drop. In a case where one-side short-circuit has occurred in the semiconductor switch 90 so that a voltage arises on the positive side, if a load such as the relay 12 is not provided, a period during which the voltage coincides with a value close to the maximum value is long as shown by a dotted line of an ellipse in (b) and therefore determination can be performed. However, if the load is provided, the input voltage drops quickly as shown by a solid line, and therefore determination cannot be performed by the method of determination [2″] using the condition of coincidence with the maximum value.

Figure 10:
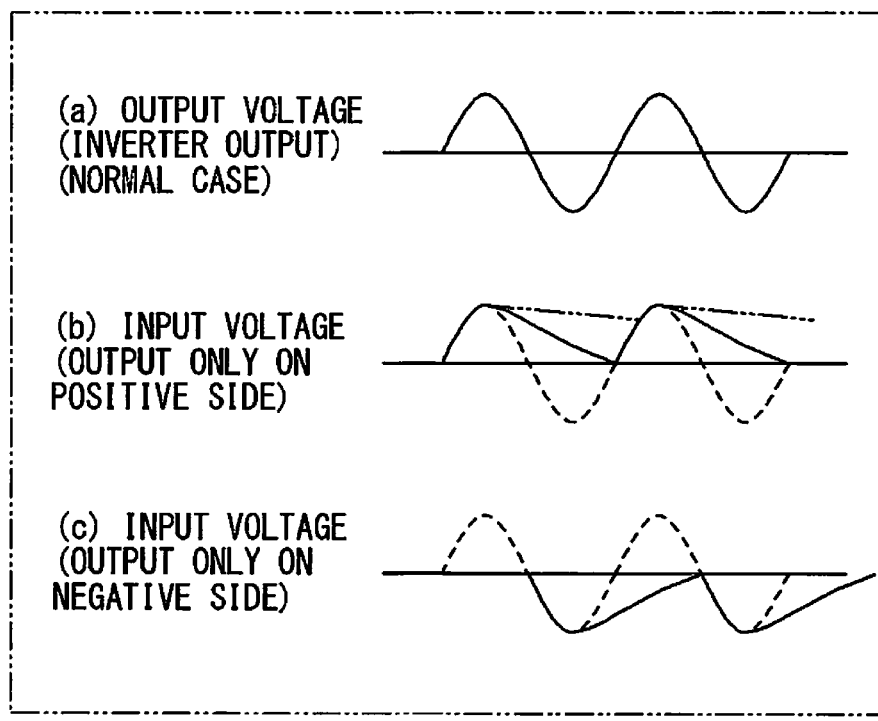
FIG. 10 is a diagram showing waveforms of the input voltage in a case of short-circuit only for the positive side ((b) in FIG. 10) and in a case of short-circuit only for the negative side ((c) in FIG. 10), in relation to determination [5].

FIG. 10 is a diagram showing waveforms of the input voltage in a case of short-circuit only for the positive side ((b) in FIG. 10) and in a case of short-circuit only for the negative side ((c) in FIG. 10). In an inverter output voltage waveform ((a) in FIG. 10) in a normal case, the average value of the positive-side voltage is around 90 V and the average value of the negative-side voltage is around −90 V. In a case where the semiconductor switch 90 has failed on one side, in the input voltage waveform with an output only on the positive side ((b) in FIG. 10), the average value of the positive-side voltage is 65 to 130 V and the average value of the negative-side voltage is approximately zero. In the waveform with an output only on the negative side ((c) in FIG. 10), the average value of the negative-side voltage is −65 to −130 V and the average value of the positive-side voltage is approximately zero.

Therefore, if the average value on only one of the positive side and the negative side is at a certain level, the semiconductor switch 90 can be determined to be short-circuited on one side. Accordingly, the average values on the positive side and the negative side are calculated per one cycle, and if a state in which the average value on only one of the positive side and the negative side is at a certain level continues during several cycles, the determination can be established.

Figure 11:
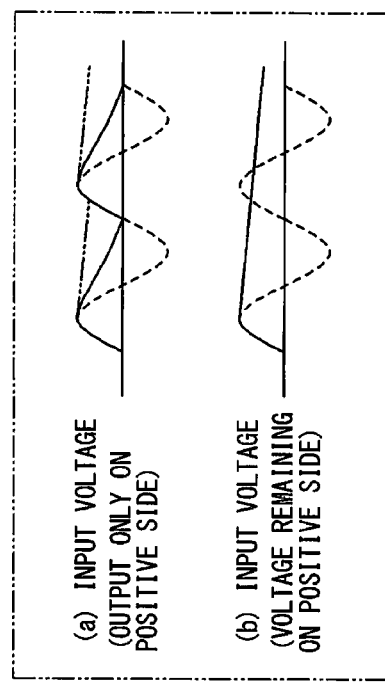
FIG. 11 shows a waveform with an output only on the positive side and a waveform with a voltage remaining on the positive side, in relation to determination [5].
Figure 12:
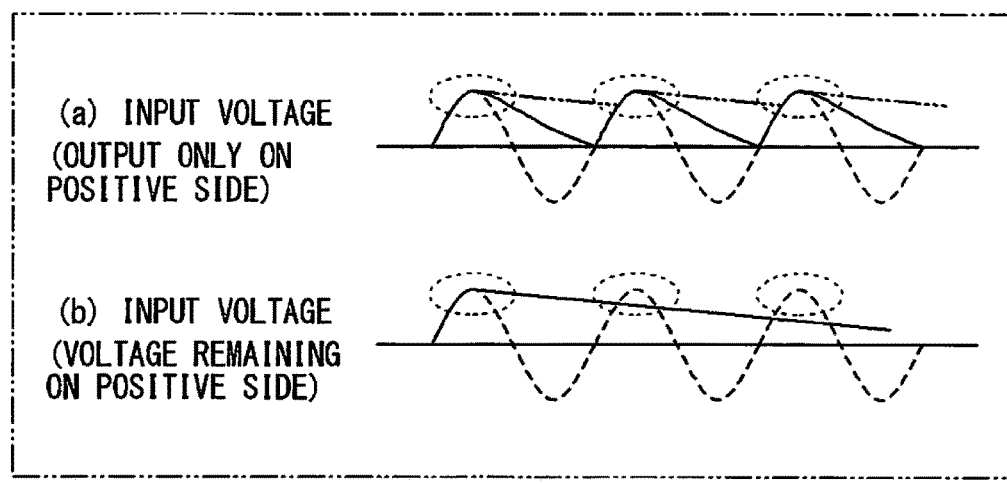
FIG. 12 shows a waveform with an output only on the positive side and a waveform with a voltage remaining on the positive side, in relation to determination [5].

FIG. 11 and FIG. 12 show a waveform with an output only on the positive side and a waveform with a voltage remaining on the positive side. As shown in FIG. 11, there is a possibility that erroneous determination based on such a remaining voltage is performed. Accordingly, as shown in FIG. 12, whether or not the maximum values or the minimum values of the input and the output in one AC cycle are close to each other is also determined together.

(Determination Condition for Determination [5])

In a state in which an AC voltage is not supplied from outside to the input end Tin and the AC switch 9 is controlled to be opened and in which the bidirectional inverter 7 is caused to operate, the control unit 10 determines that the AC switch 9 has failed if the following state continues during a predetermined period or longer (e.g., such a state is detected twelve cycles successively), the state being a state in which: the first voltage sensor 5 and the second voltage sensor 6 both detect voltages of which the absolute values of the average values in one AC cycle on one of the positive side and the negative side are equal to or greater than a predetermined value (e.g., 50 V), and detect voltages of which the absolute values of the average values in one AC cycle on the other of the positive side and the negative side are equal to or smaller than a predetermined value (e.g., 10 V); and a difference between the maximum values or the minimum values, in a half AC cycle, of the voltage detected by the first voltage sensor 5 and the voltage detected by the second voltage sensor 6 is equal to or smaller than a predetermined value (e.g., 10 V).

On the basis of this determination, it is possible to prevent a voltage based on the output voltage of the bidirectional inverter 7 from arising at the input end when the AC switch 9 has failed.

(Execution Timing)

The control unit 10 can execute all of the various determinations described above, at the following timings.

Before start of operation of the power supply unit 100: determination [1]

Before start of output from the bidirectional inverter 7: determination [3]

At the start of output from the bidirectional inverter 7: determinations [2], [2']

During output operation of bidirectional inverter 7: determinations [2"], [4], [5]

It is also possible that the control unit 10 executes only some determinations selected from the above determinations.

(Overview)

The overview of the above content will be shown below. In a state in which the AC switch 9 is controlled to be opened, if current conduction via the AC switch 9 is detected on the basis of the operation state of the bidirectional inverter 7, the input voltage, and the output voltage, the control unit 10 determines that the AC switch 9 has failed, and stops the bidirectional inverter 7.

In this power supply unit, it is possible to detect failure (welding or short-circuit) of the AC switch by two voltage sensors and the control unit on the basis of a fact that, when the AC switch has failed to be constantly conductive, a voltage that should not occur in a normal state is detected as the input voltage or the output voltage. If the failure is detected, the bidirectional inverter is stopped, whereby occurrence of a voltage due to the output of the bidirectional inverter can be reliably prevented.

The backfeed protection method for the power supply unit is performed as follows:

in a state in which the AC switch 9 is controlled to be opened, if states, of the input voltage and the output voltage, that should occur when the AC switch 9 is opened are detected, the AC switch 9 is determined to be normal; and in a state in which the AC switch 9 is controlled to be opened, if states, of the input voltage and the output voltage, that should occur when the AC switch 9 is closed are detected, the AC switch 9 is determined to have failed and the bidirectional inverter 7 is stopped.

In this backfeed protection method for the power supply unit, it is possible to detect failure (welding or short-circuit) of the AC switch by two voltage sensors and the control unit on the basis of a fact that, when the AC switch has failed to be constantly conductive, a voltage that should not occur in a normal state is detected as the input voltage or the output voltage. If the failure is detected, the bidirectional inverter is stopped, whereby occurrence of a voltage due to the output of the bidirectional inverter can be reliably prevented.

<<Supplement>>

It is noted that the embodiments disclosed herein are merely illustrative in all aspects and should not be recognized as being restrictive. The scope of the present invention is defined by the scope of the claims, and is intended to include meaning equivalent to the scope of the claims and all modifications within the scope.

[Additional Note]

The above description includes the features in the additional note below. That is, the power supply unit can also be expressed as follows.

A power supply unit including:

an AC path from an input end to an output end in the power supply unit;

a first voltage sensor configured to detect an input voltage at the input end;

a second voltage sensor configured to detect an output voltage at the output end;

a bidirectional inverter connected to the AC path and being capable of bidirectional power conversion;

a storage battery connected to the AC path via the bidirectional inverter;

an AC switch provided between the input end and a point at which the bidirectional inverter is connected to the AC path; and a control unit configured to control the bidirectional inverter and the AC switch, the control unit being configured such that, in a state in which the AC switch is controlled to be opened, if it is estimated that current conduction via the AC switch occurs on the basis of an operation state of the bidirectional inverter, the input voltage, and the output voltage without reception of a signal relevant to an opened/closed state from the AC switch itself, the control unit determines that the AC switch has failed, and stops the bidirectional inverter.

REFERENCE SIGNS LIST

1 plug
2 earth leakage circuit breaker
3 AC power outlet
4 AC path
5 first voltage sensor
6 second voltage sensor
7 bidirectional inverter
8 storage battery
9 AC switch
10 control unit
11 outlet
12 relay
90 semiconductor switch
91 relay contact
100 power supply unit
Tin input end
Tout output end
P connection point
Q1, Q2 semiconductor switch element
d1,d2 parallel diode

The invention claimed is:
1. A power supply unit comprising:
an AC path from an input end to an output end in the power supply unit;
a first voltage sensor configured to detect an input voltage at the input end;
a second voltage sensor configured to detect an output voltage at the output end;
a bidirectional inverter connected to the AC path and being capable of bidirectional power conversion;
a storage battery connected to the AC path via the bidirectional inverter;
an AC switch provided between the input end and a point at which the bidirectional inverter is connected to the AC path; and
a control unit configured to control the bidirectional inverter and the AC switch, the control unit being configured such that, in a state in which the AC switch is controlled to be opened, if current conduction via the AC switch is detected on the basis of an operation state of the bidirectional inverter, the input voltage, and the output voltage, the control unit determines that the AC switch has failed, and stops the bidirectional inverter.
2. The power supply unit according to claim 1, wherein the AC switch is formed of: an electromagnetically-driven-type relay contact; a bidirectional semiconductor switch; or the relay contact and the semiconductor switch connected in parallel with each other.
3. The power supply unit according to claim 1, wherein in a state in which an AC voltage is supplied from outside to the input end and the AC switch is controlled to be opened and in which the bidirectional inverter is not caused to operate, the control unit determines that the AC switch has failed if the first voltage sensor and the second voltage sensor both detect voltages having effective values equal to or greater than a predetermined value and the second voltage sensor repeatedly detects a voltage of which an absolute value of an instantaneous value is equal to or greater than a predetermined value.
4. The power supply unit according to claim 1, wherein in a state in which an AC voltage is not supplied from outside to the input end and the AC switch is controlled to be opened and in which the bidirectional inverter is started to operate, the control unit determines that the AC switch has failed if the following state continues during a predetermined period or longer, the state being a state in which: the first voltage sensor and the second voltage sensor both detect voltages having effective values equal to or greater than a predetermined value; and an absolute value of a difference between an instantaneous value of the voltage detected by the first voltage sensor and an instantaneous value of the voltage detected by the second voltage sensor is equal to or smaller than a predetermined value.
5. The power supply unit according to claim 1, wherein in a state in which an AC voltage is not supplied from outside to the input end and the AC switch is controlled to be opened and in which the bidirectional inverter is started to operate, the control unit determines that the AC switch has failed if the following state continues during a predetermined period or longer, the state being a state in which: the first voltage sensor and the second voltage sensor both detect voltages having effective values equal to or greater than a predetermined value; a difference between maximum values or minimum values, in one AC cycle, of an instantaneous value of the voltage detected by the first voltage sensor and an instantaneous value of the voltage detected by the second voltage sensor is equal to or smaller than a predetermined value.
6. The power supply unit according to claim 1, wherein in a case where the bidirectional inverter is started to operate while an AC voltage is supplied from outside to the input end, the control unit provides a no-output period until the operation of the bidirectional inverter is started, after controlling the AC switch to be opened, and
the control unit determines that the AC switch has failed if, in the no-output period, the following state continues during a predetermined period or longer, the state being a state in which: the first voltage sensor and the second voltage sensor detect voltage values equal to or greater than a predetermined value; and an absolute value of a difference between an instantaneous value of the voltage detected by the first voltage sensor and an instantaneous value of the voltage detected by the second voltage sensor is equal to or smaller than a predetermined value.
7. The power supply unit according to claim 1, wherein irrespective of whether or not an AC voltage is being supplied from outside to the input end, in a state in which the AC switch is controlled to be opened and the bidirectional inverter is caused to operate, the control unit actively changes electric characteristics of an output of the bidirectional inverter, and
the control unit determines that the AC switch has failed if it is detected that change occurring in the voltage detected by the first voltage sensor follows the voltage detected by the second voltage sensor.
8. The power supply unit according to claim 1, wherein in a state in which an AC voltage is not supplied from outside to the input end and the AC switch is controlled to be opened and in which the bidirectional inverter is caused to operate, the control unit determines that the AC switch has failed if the following state occupies a predetermined time proportion, the state being a state in which: the first voltage sensor and the second voltage sensor both detect voltages having effective values equal to or greater than a predetermined value; and a difference between maximum values or minimum values, in one AC cycle, of an instantaneous value of the voltage detected by the first voltage sensor and an instantaneous value of the voltage detected by the second voltage sensor is equal to or smaller than a predetermined value.
9. The power supply unit according to claim 1, wherein in a state in which an AC voltage is not supplied from outside to the input end and the AC switch is controlled to be opened and in which the bidirectional inverter is caused to operate, the control unit determines that the AC switch has failed if the following state continues during a predetermined period or longer, the state being a state in which: the first voltage sensor and the second voltage sensor both detect voltages of which absolute values of average values in one AC cycle on one of a positive side and a negative side are equal to or greater than a predetermined value, and detect voltages of which absolute values of average values in one AC cycle on the other of the positive side and the negative side are equal to or smaller than a predetermined value; and a difference between maximum values or minimum values, in a half AC cycle, of an instantaneous value of the voltage detected by the first voltage sensor and an instantaneous value of the voltage detected by the second voltage sensor is equal to or smaller than a predetermined value.

10. A backfeed protection method for a power supply unit, the power supply unit including: an AC path from an input end to an output end in the power supply unit; a first voltage sensor configured to detect an input voltage at the input end; a second voltage sensor configured to detect an output voltage at the output end; a bidirectional inverter connected to the AC path and being capable of bidirectional power conversion; a storage battery connected to the AC path via the bidirectional inverter; an AC switch provided between the input end and a point at which the bidirectional inverter is connected to the AC path; and a control unit configured to control the bidirectional inverter and the AC switch, the backfeed protection method being executed by the control unit and comprising:
in a state in which the AC switch is controlled to be opened, if states, of the input voltage and the output voltage, that should occur when the AC switch is opened are detected, determining that the AC switch is normal; and
in a state in which the AC switch is controlled to be opened, if states, of the input voltage and the output voltage, that should occur when the AC switch is closed are detected, determining that the AC switch has failed and stopping the bidirectional inverter.

11. A power supply unit comprising:
an AC path from an input end to an output end in the power supply unit;
a first voltage sensor configured to detect an input voltage at the input end;
a second voltage sensor configured to detect an output voltage at the output end;
a bidirectional inverter connected to the AC path and being capable of bidirectional power conversion;
a storage battery connected to the AC path via the bidirectional inverter;
an AC switch provided between the input end and a point at which the bidirectional inverter is connected to the AC path; and
a control unit configured to control the bidirectional inverter and the AC switch, the control unit being configured such that, in a state in which the AC switch is controlled to be opened, if it is estimated that current conduction via the AC switch occurs on the basis of an operation state of the bidirectional inverter, the input voltage, and the output voltage without reception of a signal relevant to an opened/closed state from the AC switch itself, the control unit determines that the AC switch has failed, and stops the bidirectional inverter.

12. The power supply unit according to claim 2, wherein in a state in which an AC voltage is supplied from outside to the input end and the AC switch is controlled to be opened and in which the bidirectional inverter is not caused to operate, the control unit determines that the AC switch has failed if the first voltage sensor and the second voltage sensor both detect voltages having effective values equal to or greater than a predetermined value and the second voltage sensor repeatedly detects a voltage of which an absolute value of an instantaneous value is equal to or greater than a predetermined value.

13. The power supply unit according to claim 2, wherein in a state in which an AC voltage is not supplied from outside to the input end and the AC switch is controlled to be opened and in which the bidirectional inverter is started to operate, the control unit determines that the AC switch has failed if the following state continues during a predetermined period or longer, the state being a state in which: the first voltage sensor and the second voltage sensor both detect voltages having effective values equal to or greater than a predetermined value; and an absolute value of a difference between an instantaneous value of the voltage detected by the first voltage sensor and an instantaneous value of the voltage detected by the second voltage sensor is equal to or smaller than a predetermined value.

14. The power supply unit according to claim 2, wherein in a state in which an AC voltage is not supplied from outside to the input end and the AC switch is controlled to be opened and in which the bidirectional inverter is started to operate, the control unit determines that the AC switch has failed if the following state continues during a predetermined period or longer, the state being a state in which: the first voltage sensor and the second voltage sensor both detect voltages having effective values equal to or greater than a predetermined value; a difference between maximum values or minimum values, in one AC cycle, of an instantaneous value of the voltage detected by the first voltage sensor and an instantaneous value of the voltage detected by the second voltage sensor is equal to or smaller than a predetermined value.

15. The power supply unit according to claim 2, wherein in a case where the bidirectional inverter is started to operate while an AC voltage is supplied from outside to the input end, the control unit provides a no-output period until the operation of the bidirectional inverter is started, after controlling the AC switch to be opened, and
the control unit determines that the AC switch has failed if, in the no-output period, the following state continues during a predetermined period or longer, the state being a state in which: the first voltage sensor and the second voltage sensor detect voltage values equal to or greater than a predetermined value; and an absolute value of a difference between an instantaneous value of the voltage detected by the first voltage sensor and an instantaneous value of the voltage detected by the second voltage sensor is equal to or smaller than a predetermined value.

16. The power supply unit according to claim 2, wherein irrespective of whether or not an AC voltage is being supplied from outside to the input end, in a state in which the AC switch is controlled to be opened and the bidirectional inverter is caused to operate, the control unit actively changes electric characteristics of an output of the bidirectional inverter, and
the control unit determines that the AC switch has failed if it is detected that change occurring in the voltage detected by the first voltage sensor follows the voltage detected by the second voltage sensor.

17. The power supply unit according to claim 2, wherein in a state in which an AC voltage is not supplied from outside to the input end and the AC switch is controlled to be opened and in which the bidirectional inverter is caused to operate, the control unit determines that the AC switch has failed if the following state occupies a predetermined time proportion, the state being a state in which: the first voltage sensor and the second voltage sensor both detect voltages having effective values equal to or greater than a predetermined value; and a difference between maximum values or minimum values, in one AC cycle, of an instantaneous value of the voltage detected by the first voltage sensor and an instantaneous value of the voltage detected by the second voltage sensor is equal to or smaller than a predetermined value.

18. The power supply unit according to claim 2, wherein in a state in which an AC voltage is not supplied from outside to the input end and the AC switch is controlled to be opened and in which the bidirectional inverter is caused to operate, the control unit determines that the AC switch has failed if the following state continues during a predetermined period or longer, the state being a state in which: the first voltage sensor and the second voltage sensor both detect voltages of which absolute values of average values in one AC cycle on one of a positive side and a negative side are equal to or greater than a predetermined value, and detect voltages of which absolute values of average values in one AC cycle on the other of the positive side and the negative side are equal to or smaller than a predetermined value; and a difference between maximum values or minimum values, in a half AC cycle, of an instantaneous value of the voltage detected by the first voltage sensor and an instantaneous value of the voltage detected by the second voltage sensor is equal to or smaller than a predetermined value.

* * * * *